Figure 1:
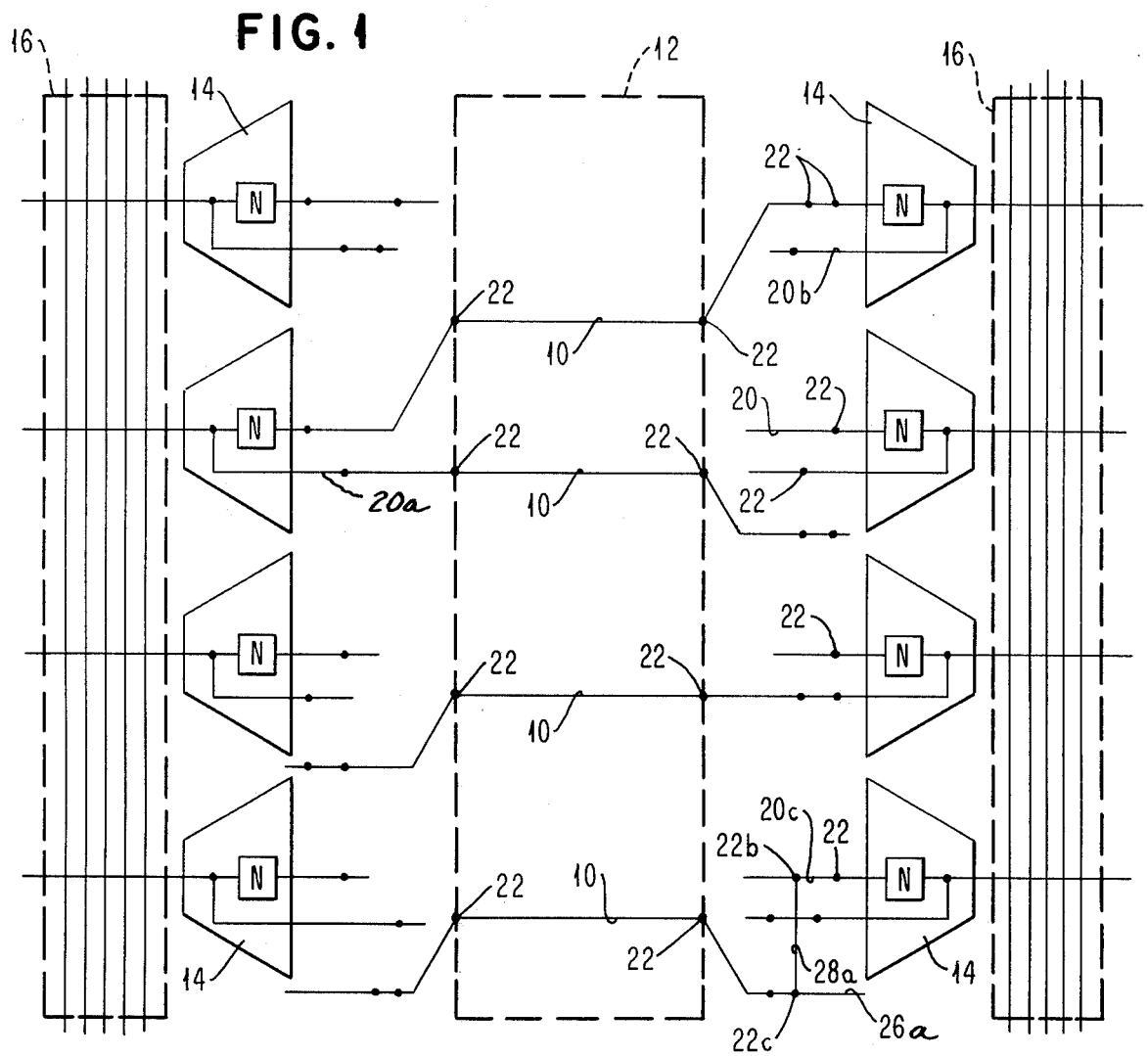

United States Patent [19]

Hong et al.

[11] 4,029,970

[45] June 14, 1977

[54] CHANGEABLE DECODER STRUCTURE FOR A FOLDED LOGIC ARRAY

[75] Inventors: Se J. Hong; Daniel L. Ostapko, both of Poughkeepsie, N.Y.

[73] Assignee: IBM Corporation, Armonk, N.Y.

[22] Filed: Nov. 6, 1975

[21] Appl. No.: 629,259

[52] U.S. Cl. .............................. 307/207; 235/152; 307/241; 307/DIG. 5; 328/92

[51] Int. Cl.² .................. H03K 19/20; G06F 9/00; H03K 13/00

[58] Field of Search .......... 307/207, 204, 205, 213, 307/DIG. 5, 270, 241–243; 235/152; 328/92, 103, 95–97

[56] References Cited

UNITED STATES PATENTS

| | | | |
|---|---|---|---|
| 3,816,725 | 6/1974 | Greer | 307/207 X |
| 3,829,846 | 8/1974 | Berg et al. | 235/152 X |
| 3,849,638 | 11/1974 | Greer | 307/207 X |
| 3,936,812 | 2/1976 | Cox et al. | 235/152 X |

OTHER PUBLICATIONS

Howley et al., "Programmable Logic Array Decoding Technique"; IBM Tech. Discl. Bull., vol. 17, No. 10, p. 2988, Mar. 1975.

Primary Examiner—John S. Heyman
Assistant Examiner—Larry N. Anagnos
Attorney, Agent, or Firm—James E. Murray

[57] ABSTRACT

This specification describes a decoder for a programmable logic array (PLA) having opposite ends of input lines of the array connected to outputs of different decoders. Previously two-bit decoders were arranged on opposite sides of the array to generate input variables from two sets of two different input signals each and feed those input variables to four input lines. Here, instead of using two-bit decoders, four one-bit decoders are positioned on each side. The outputs of these one-bit decoders are programmable to change the connections between them and the input lines of the array. The arrangement permits the decoders to perform one-bit, two-bit decoding on signals on the same side of the input lines, to do two-bit decoding on signals on opposite sides of the array and in combination with other sets of decoders to do three and four-bit decoding of input signals.

3 Claims, 13 Drawing Figures

CHANGEABLE DECODER STRUCTURE FOR A FOLDED LOGIC ARRAY

BACKGROUND OF THE INVENTION

The present invention relates to arrays for performing logic functions and more particularly relates to a new decoder for PLAs.

It is well known to perform logic in an array of identical circuit elements each located at a unique intersection of an input and output line in a grid of input and output lines. Co-pending patent applications 537,219, filed on Dec. 30, 1974; 537,218, filed on Dec. 30, 1974, now U.S. Pat. No. 3,936,812; and 591,208 filed on June 27, 1975 and assigned to the same assignee as the present invention describe such a PLA in which a number of decoders feed inputs to a first array called a product term generator or an AND array which in turn supplies outputs to a second array called a sum of product term generator or an OR array. The input lines of these arrays each have input variables fed to either or both ends. When input variables are fed to both ends of an input line, the input line is segmented to separate logic functions performed on input variable fed to one end from logic functions performed on input variables fed to the other end. The input variables to the AND array are the outputs of two, two-bit decoders. Each two-bit decoder feeds one side of four input lines. This permits the four input lines to perform logic functions involving two sets of variables each made up of all the possible combinations of two binary input signals fed to the same side of the array. Co-pending patent application, Serial Number 629,260, filed on even date herewith described a decoder in which each four input lines are connected to four one-bit decoders at their opposite ends. The decoders and the input lines are interconnected so that each two input variables are presented at each end so they will perform the usual two-bit decoding onto the four input lines. However, connections between the decoders and input lines of the array can be broken to perform logic functions of single variables and of sets of variables made up of one input signal on either side of the array. While this is a considerable improvement in flexibility, it would be advantageous to perform logic functions of three, four or more variables in addition to the above mentioned combination of logic functions.

THE INVENTION

Therefore, in accordance with the present invention a new decoder is provided that permits performing logic on functions of two variables both positioned on the same side of the AND array with functions of two variables positioned on opposite sides of the AND array or logic functions of single variables and to be used in combination with other decoders to perform logic functions involving sets of three or more input variables. Instead of having four input lines connected at opposite ends to one output of a different two-bit decoder, each of the four lines is connected to a rail system that can be changed to connect the lines to a one or more one-bit decoder of a single variable. The flexibility of the system permits the decoding of sets of one, two, three and four variables merely by changing the connection in the rails.

Therefore, it is an object of the present invention to provide a new decoder for use with a logic array.

It is another object of the present invention to provide a decoder that permits more variations in functions performed by it.

THE DRAWINGS

These and other objects can best be understood by referring to the accompanying figures of which:

FIG. 1 shows an arrangement of decoders and input lines interconnected in accordance with the present invention;

FIGS. 2 thru 7 show various decoding functions of one, two, three and four input variables that can be performed by the decoder shown in FIG. 1; and, FIGS. 8 thru 13 show how the inputs and output connections of the decoders of FIG. 1 can be personalized to perform the various decoding functions shown in FIGS. 2 thru 7.

EMBODIMENT OF THE INVENTION

Referring now to FIG. 1, each four lines 10 in the AND array 12 of the PLA described in the above mentioned co-pending patent application is positioned opposite two sets of four single bit input decoders 14 arranged on opposite sides of the array. These input decoders are fed input signals thru a rail system 16 as described and claimed in the above mentioned co-pending patent application Ser. No. 537,218, filed Dec. 30, 1974 so that inputs to the decoders 14 can be changed as desired.

The output lines 20 of the decoders are lines that are diffused into the substrate of the semiconductor chip containing the PLA. Certain of these diffused output lines 20 such as line 20a are unchangeably coupled to one of the input lines 10 of the array 12 formed of a metallized pattern on the upper surface of an oxide passivization layer on top of the substrate through a metallized via hole 22a that passes through the oxide layer. Examples of such via hole connections between metallized lines can be found in the first referenced co-pending applications.

Other of the output lines like line 20b are not necessarily connected to any of the input lines 10. Likewise, certain of the input lines 10 of the array have diffused extensions 26 instead of being fixed to the output line 20 of a decoder. However, each of the output lines 20 and extension 26 have a number of via holes 22 placed above them to permit selective connections between the diffused lines 20 and 26.

The selective connections are performed by metal lines such as line 28a that will join diffused lines such as line 20c to a diffused portion of the input lines 26a through two metallized via holes 22b and 22c. The via holes are arranged so that connections can be made between the various lines by straight line metallized segments 28 on top of the insulating layer of the chip.

Figure 2:
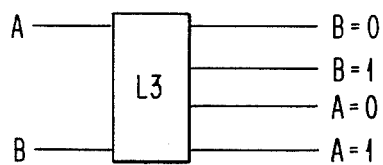
Figure 2:
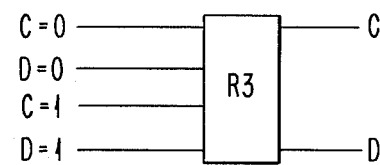
Figure 3:
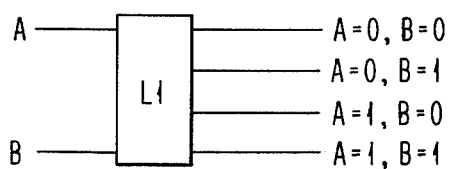
Figure 3:
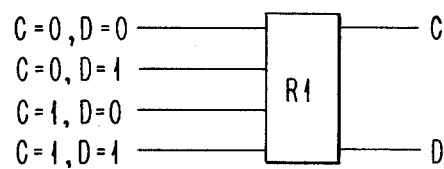
Figure 4:
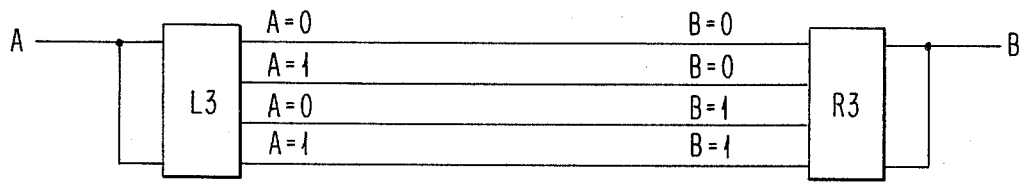

With this arrangement decoders 14 can be connected to decode input signals in a number of ways. First of all, as shown in FIG. 2, the arrangement shown in FIG. 1 can be used to provide a single bit decode of four inputs A to D or as shown in FIG. 3, to provide a two-bit decode of two sets of inputs AB and CD arranged on opposite sides of the array. In both these cases the input lines 10 must be segmented in the manner described in the above mentioned co-pending applications to isolate functions. In addition, like the arrangement shown in co-pending application Serial Number 629,260, filed on even date herewith the input lines 10 can be retained unsegmented to decode a set of two input variables where the inputs are on opposite sides of the array.

Figure 5:
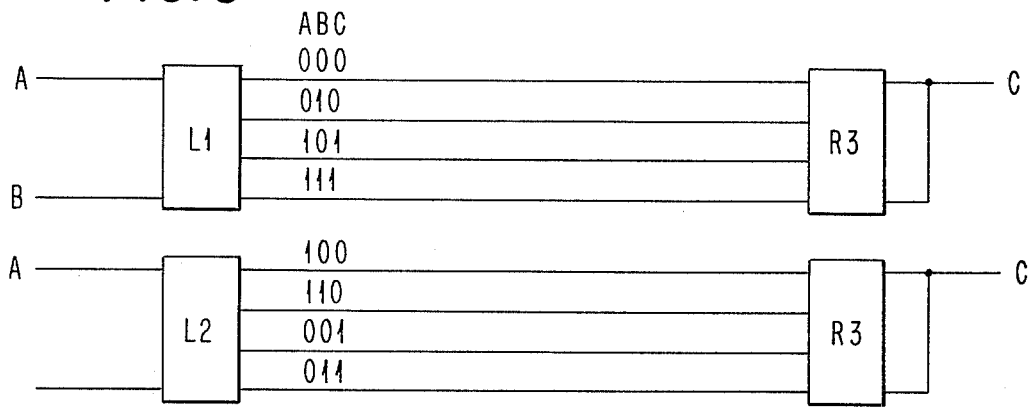
Figure 6:
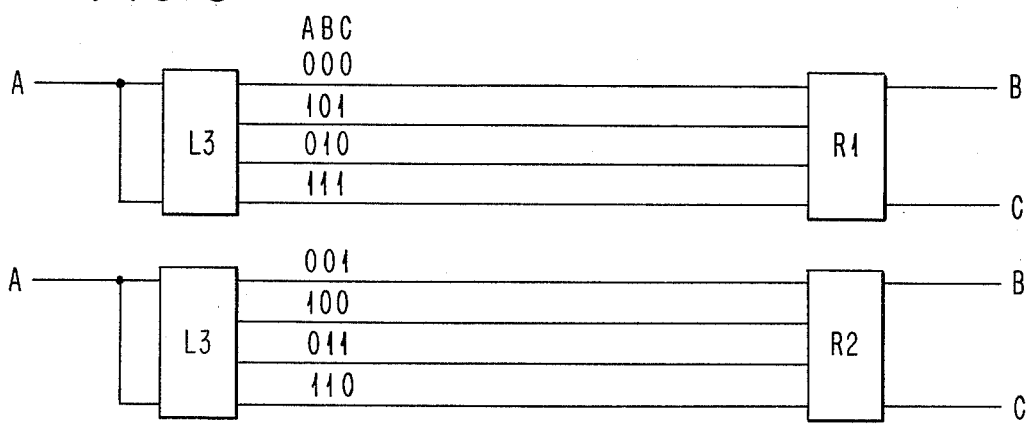
Figure 7:
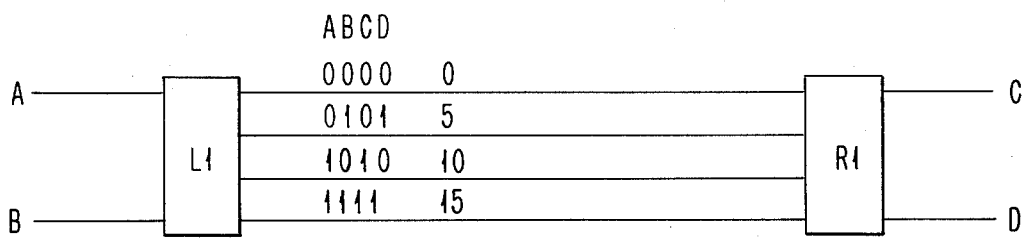
Figure 7:
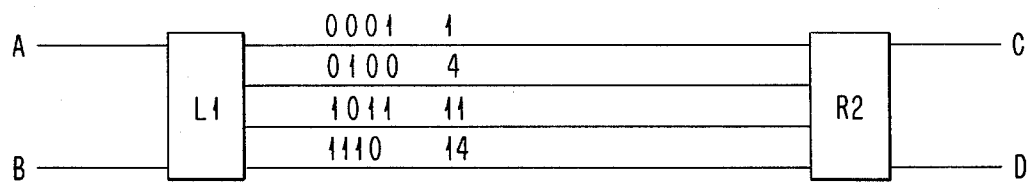
Figure 7:
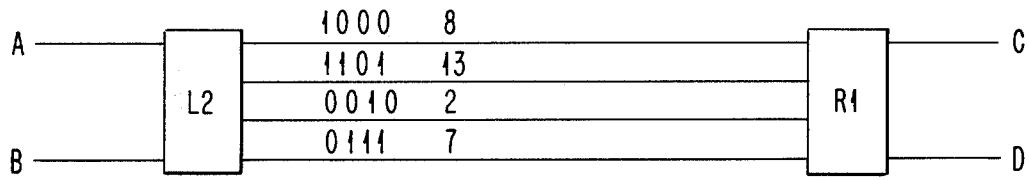
Figure 7:
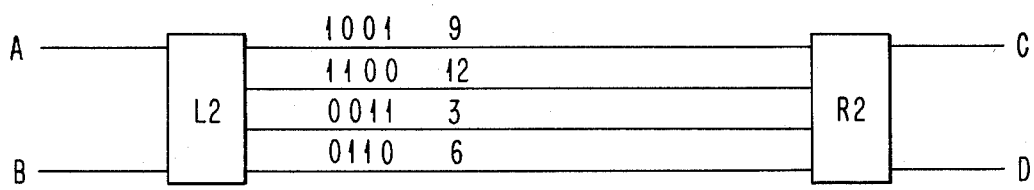
Figure 8:
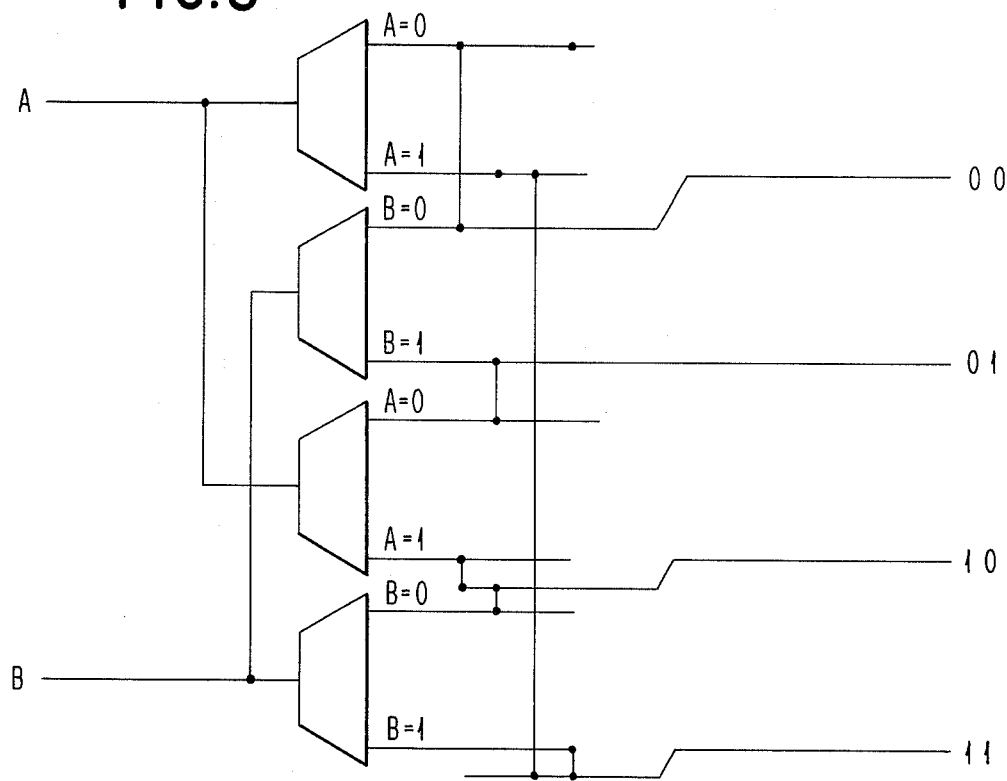
Figure 9:
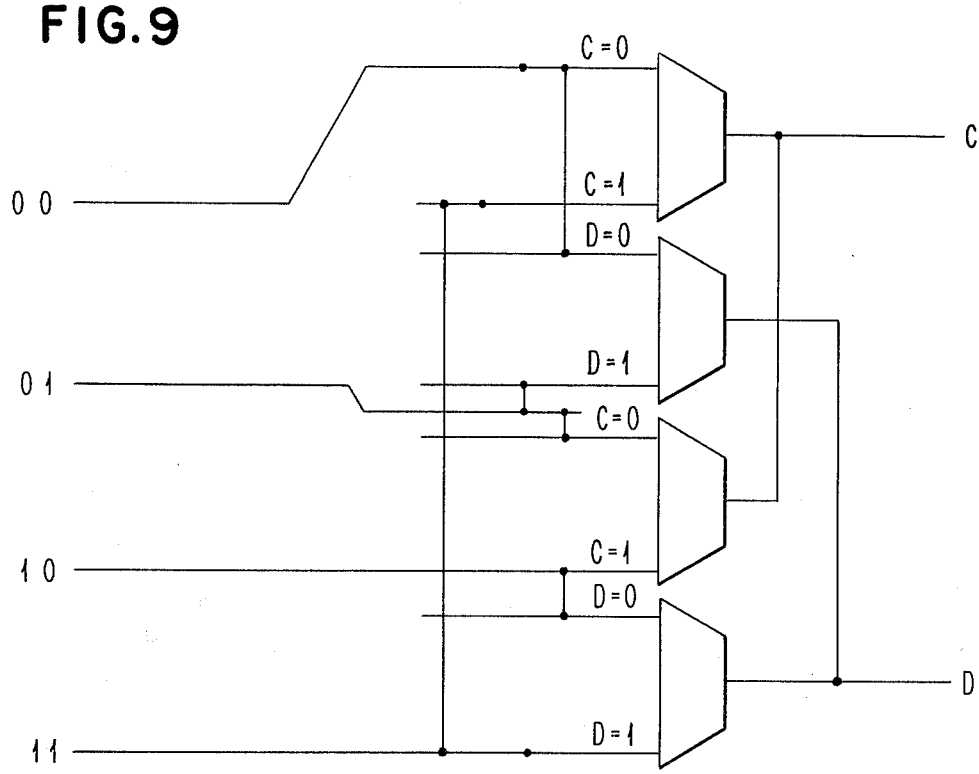
Figure 10:
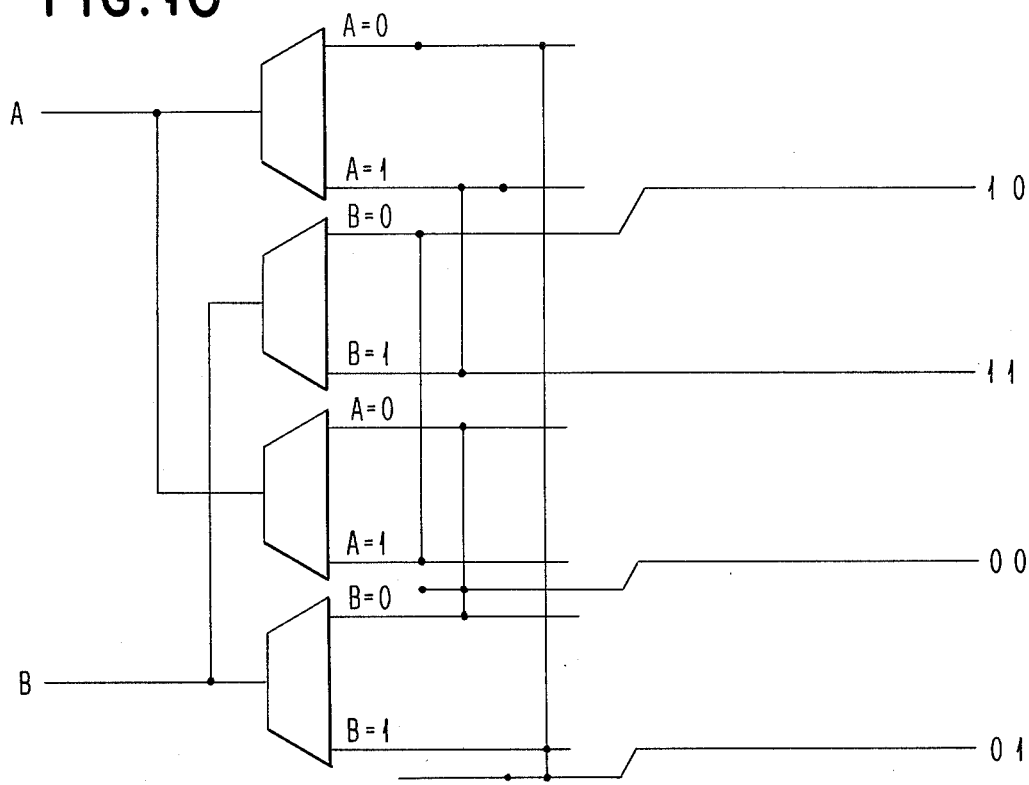
Figure 11:
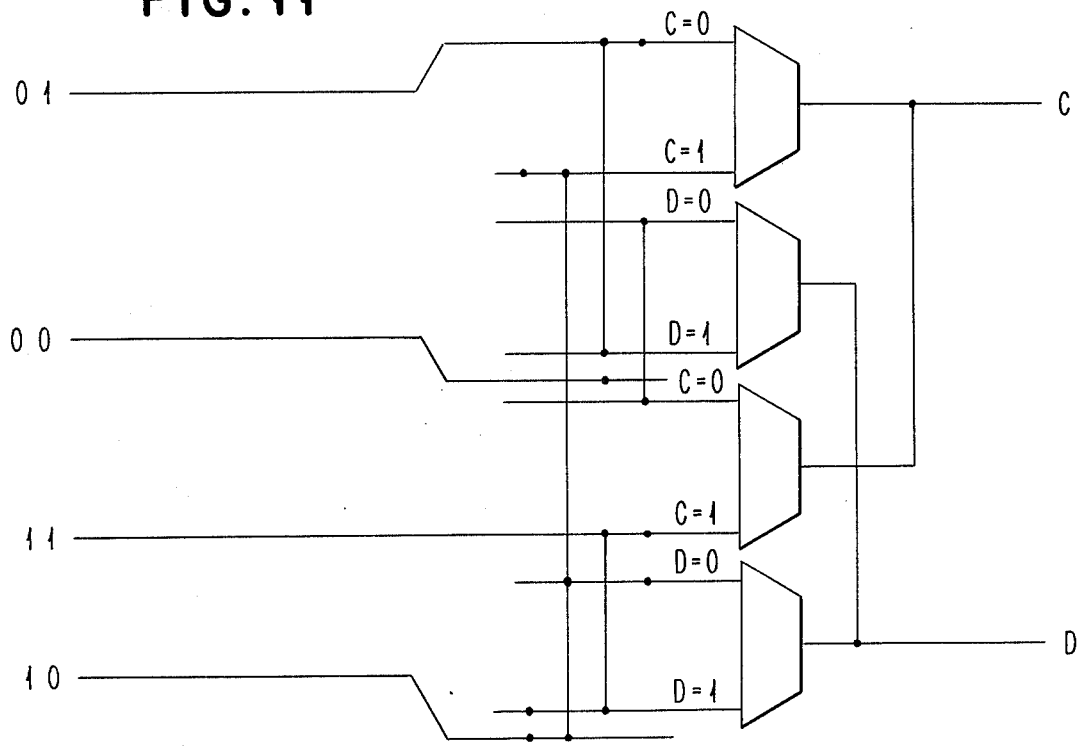
Figure 12:
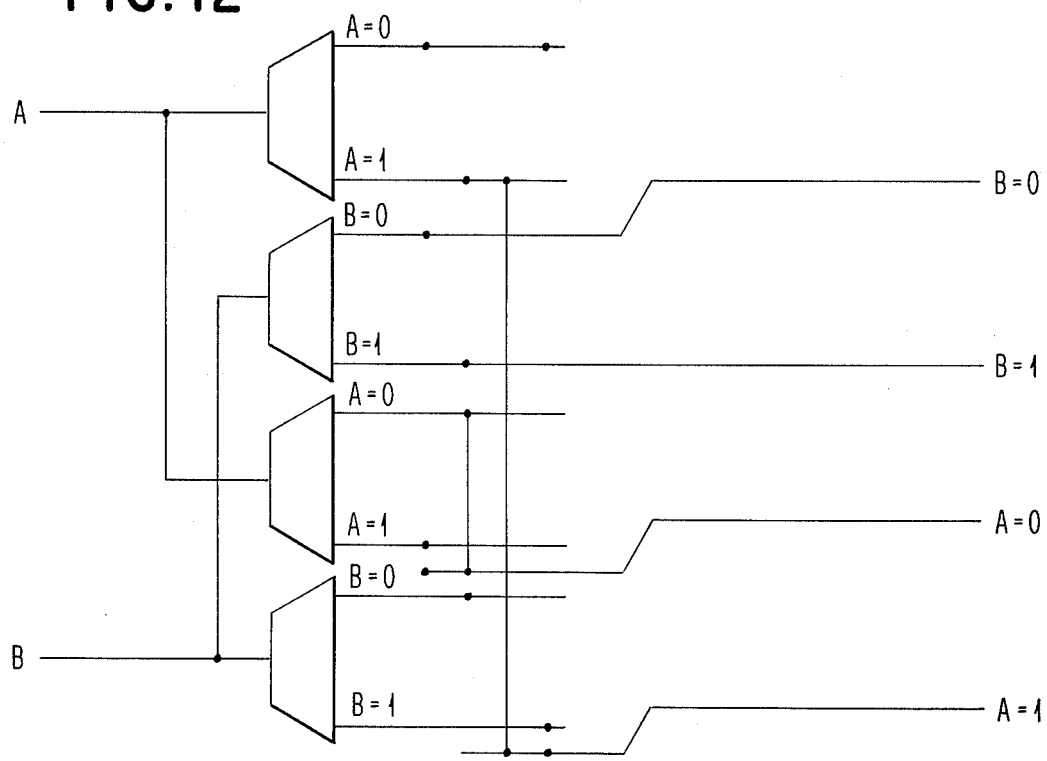
Figure 13:
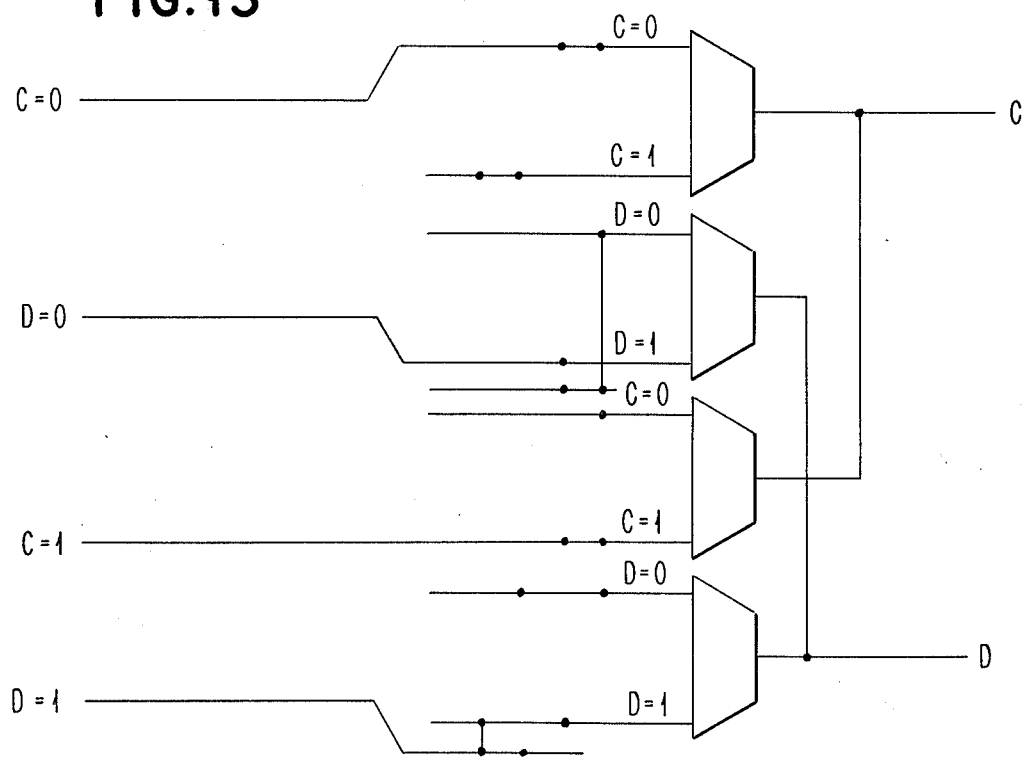

Furthermore, the decoder of the present invention can decode three or more input variables in the manner described in FIGS. 5, 6 and 7 by using two or more sets of the lines 10 and decoders 14 shown in FIG. 1. In each of the FIGS. 2 thru 7 a set of four decoders are given a letter-number combination that represents a particular configuration of the connection to and from four decoders shown in FIG. 1. Decoders on the lefthand side of the array are numbered L1 thru L3 while the decoders on the righthand side are numbered R1 thru R3. FIGS. 8 thru 13 show the various configurations for the output decoders. FIG. 8 is the L1 configuration. FIG. 9 is the R1 configuration. FIG. 10 is the L2 configuration, FIG. 11 is the R2 configuration while FIGS. 12 and 13 are the L3 and R3 combinations respectively. By substituting decoders shown in FIGS. 8 to 13 in the position of each box marked with its number designation shown in FIGS. 2 to 7 can be performed as shown.

Therefore it can be seen that we have described a decoder system that can be changed merely by changing the metallization pattern on the top surface of the array to perform any one of a number of different decoding functions, and it should be apparent that while the invention has been particularly shown and described with reference to a preferred embodiment thereof, it will be understood by those skilled in the art that the above and other changes in form and details may be made therein without departing from the spirit and scope of the invention.

What is claimed is:

1. In a programmable logic array of the type comprising at least two arrays in which one of the arrays receives binary input variables on its input lines from decoders that generate those input variables from binary input signals and feeds the responses thereto on its output lines to a second array, an arrangement for driving a plurality of groups of four input lines of the first array at both ends to provide on the input lines all possible combinations of at least three input signals comprising:

two sets of one-bit decoders positioned on each side of the first array adjacent to each group of four input lines, selective input means coupled to the inputs of the decoders for supplying at least one input signal to the inputs of sets of decoders serving one side of at least two groups of four unsegmented input lines and supplying two input variables to the inputs of sets of decoders serving the other side of said at least two groups of input lines, selective output means coupling the outputs of one-bit decoders from the two sets to said groups of input lines of the first array for selectively placing three or more outputs from said one-bit decoders positioned on both sides of the first array on various ones of the input lines in said groups of at least two groups of input lines so that those three or more outputs of the decoders are dot ORd on the various ones of the input lines whereby three and four-bit decoding using two or more groups of input lines is accomplished.

2. The programmable logic array of claim 1 wherein:

said selective input means couples one input signal to the inputs of sets of decoders serving one side of two groups of four input lines; and said selective output means couples one bit decoded signals to all said lines from the sets of decoders serving said one side and couples two-bit decoded signals to all said lines from the sets of decoders serving said other side whereby the one and two-bit decoded signals are dot ORd on said line to provide all eight possible combinations of the presence and absence of three binary signals.

3. The programmable logic array of claim 1 wherein:

said selective input means couples two input signals to the inputs of the sets of decoders serving said one side of four groups of lines; and, said selective output means couples two-bit decoded signals to both ends of all three groups of lines whereby the two groups of two-bit decoded are dot ORd on the lines to provide all possible sixteen combinations of the presence and absence of four input signals.

* * * * *